United States Patent [19]

Gontowski, Jr. et al.

[11] 4,413,271
[45] Nov. 1, 1983

[54] INTEGRATED CIRCUIT INCLUDING TEST PORTION AND METHOD FOR MAKING

[75] Inventors: Walter S. Gontowski, Jr., Thompson, Conn.; James F. Mayrand, Shrewsbury, Mass.

[73] Assignee: Sprague Electric Company, North Adams, Mass.

[21] Appl. No.: 248,142

[22] Filed: Mar. 30, 1981

[51] Int. Cl.³ .............................................. H01L 27/04
[52] U.S. Cl. .................................. 357/40; 324/158 T; 357/45; 357/48; 357/51; 357/85
[58] Field of Search ................ 324/158 T; 357/40, 45, 357/85, 51, 48

[56] References Cited

U.S. PATENT DOCUMENTS

| | | |
|---|---|---|
| 3,304,594 | 2/1967 | Madland . |
| 3,465,427 | 9/1969 | Barson .................................... 357/51 |
| 3,507,036 | 4/1970 | Antipov . |
| 3,774,088 | 11/1973 | Magdo et al. .......................... 357/40 |
| 3,808,475 | 4/1974 | Buelow et al. ......................... 357/40 |
| 3,849,872 | 11/1974 | Hubacher ............................... 357/40 |
| 4,225,877 | 9/1980 | Miles ...................................... 357/42 |
| 4,243,937 | 1/1981 | Multani et al. ................... 324/158 T |

OTHER PUBLICATIONS

Adapting Process Test Patterns to High-Reduction Projection Printers, Steven Wetterling, Proceedings of 2nd Custom Integrated Circuits Conference (held May 19–21, 1980), pp. 94–97.

Primary Examiner—William D. Larkins

[57] ABSTRACT

A test circuit, including a vertical NPN, a lateral PNP and a vertical PNP transistor plus a diffused resistor and a thin film resistor, is formed by altogether simultaneous steps with corresponding components of each principal integrated circuit. Four dedicated test pads in each integrated circuit lead to all bases, collectors, emitters and resistor extremities so as to permit substantially unshunted measurements of all basic transistor and resistor electrical parameters.

8 Claims, 4 Drawing Figures

INTEGRATED CIRCUIT INCLUDING TEST PORTION AND METHOD FOR MAKING

BACKGROUND OF THE INVENTION

This invention is related to methods for making a large number of identical integrated circuits in a single semiconductor wafer, and more particularly to such wafers having one or more separate test circuits therein that may be probed and electrically analyzed for determining the efficacy of the prior diffusion, metallization and other steps and to predict the ultimate yield after the parts are broken apart, terminated and packaged.

Methods for making integrated circuits include a great many sequential steps wherein a subsequence of masking followed by impurity doping is repeated typically from 5 to 15 times depending upon the particular structures being formed. Such a subsequence includes preparing artwork, photographically reducing the art work in the form of a transparency or photographic mask, further optically reducing the image of the photographic mask in a step for exposing to light a portion of a film of photo-lithographic resist that overlies the oxidized major surface of the silicon wafer, selectively etching away only regions of the resist that were not exposed to light, selectively etching away the oxide layer through the holes made in the resist to form a silicon oxide mask having the pattern of the artwork, removing the remainder of the resist and then by diffusing from a hot gaseous atmosphere or by ion implanting, impurities are driven through the holes in the oxide mask into the silicon surface to make a particular element of the electrical components being formed there. To make another element of the electrical components the subsequence is repeated beginning with preparing a different artwork pattern and usually ending with the diffusion of a different impurity. A similar subsequence of steps ends with selectively metallizing to interconnect the integrated circuit elements.

For making a large number of identical integrated circuits in a single silicon wafer, each of the steps in the above noted sequence is performed simultaneously for forming all of the corresponding electrical component elements in all of the large number of integrated circuits, except for the one step of illumination exposure of the resist layer. The aptly named "step-and-repeat" exposure method is used whereby a pattern of illumination, corresponding to the art work, is sequentially directed to the resist film portions overlying the first, then the second and each in turn of the large number of integrated circuits to be formed in the wafer.

It is known to provide a special integrated test circuit, several of which are substituted for ones of the large number of principal integrated circuits in the wafer. This permits testing of individual integrated circuit components such as a transistor, a resistor, etc., in the test circuit. Here the components are made accessible unlike in a principal integrated circuit that is interconnected so the components are either inaccessible or electrically shunted. Each of the bulk process steps such as oxidizing, etching, diffusing, implanting and metallizing affects the entire wafer; namely all of the integrated circuits of the wafer are affected at the same time. However, because the effect on integrated circuits in one wafer region may be slightly different than in another, the above noted several test circuits are scattered about so each represents one region, and thus lack of uniformity in the processes effects are detectable as well as are the bulk or over-all effects common to all of the integrated circuits on the wafer that can be determined from measurements on the several test circuits.

However, it is not unusual in integrated circuits manufacturing that many of the defective integrated circuits are attributable to misregistration of one or more of the oxide masks. During a step and repeat illumination of sequential ones of the integrated circuits, the physical position of the illumination pattern at any particular integrated circuit must be closely aligned with the position of all prior illumination patterns. Such successive illumination pattern alignment, or lack of it, depend upon factors that commonly pertain to an individual integrated circuit and not to a group in a region of the wafer or to the whole wafer.

The above noted several test circuits that are substituted for certain of the principal integrated circuits in a wafer do not provide detection or prediction of defects in the principle integrated circuits that result from mask misregistration.

It is a primary object of this invention to provide a means for testing at the wafer level, which, how and how many integrated circuits may be defective due to mask misregistrations as well as to bulk process step variables.

SUMMARY OF THE INVENTION

A plurality of identical integrated circuits are formed on a semiconductor wafer each one of which has a principal integrated circuit and a separate test circuit. Electrical access to each principle circuit includes a set of metal pads whereas each test circuit has another set of metal pads. A transistor of each principal circuit is formed altogether simultaneously with a transistor of a corresponding test circuit especially including the steps of registering photolithographic masks each of which contains pattern portions for forming corresponding parts of the principal and test circuit transistors. For example each illumination exposure step in a step-and-repeat process for forming in a photo resist layer a photolithographic mask includes the simultaneous exposure of the corresponding transistor elements in both the principal circuit and test circuit.

Thus every integrated circuit containing a random mask-misalignment induced defect can be detected and so marked to avoid performing the next expensive steps of die bonding, lead attachment and packaging. Final testing of only a small sample then becomes appropriate. The tests of the test circuits can easily be made at extremes of supply voltage, or over an operating temperature range or over a range of signal frequencies. Thus integrated test circuits of this invention provide an improved means of detecting and thus controlling manufacturing processes parameters, an improved means of predicting at an early stage the final yields and provide a reduction in the extent of the tests that will be made of the packaged integrated circuits at the end of the line. Furthermore, a test circuit of this invention will typically occupy only from 1 to 2 percent of each integrated circuit chip.

DESCRIPTION OF THE PREFERRED EMBODIMENTS

Figure 1:
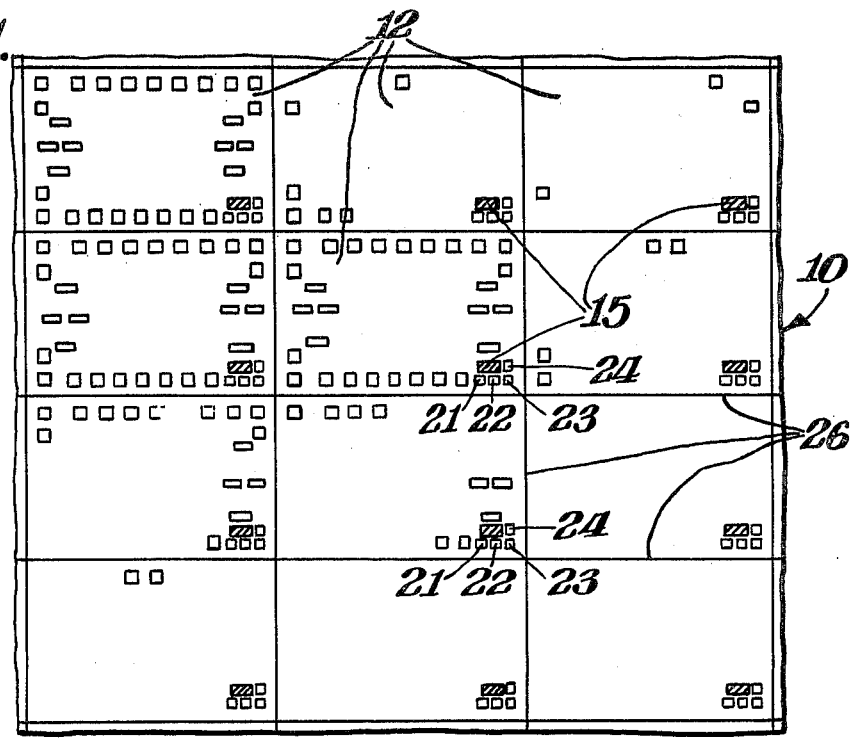
FIG. 1 shows a magnified top view of part of a silicon wafer having a matrix of identical integrated circuits formed therein, each integrated circuit having formed therewith a test pattern.
Figure 2:
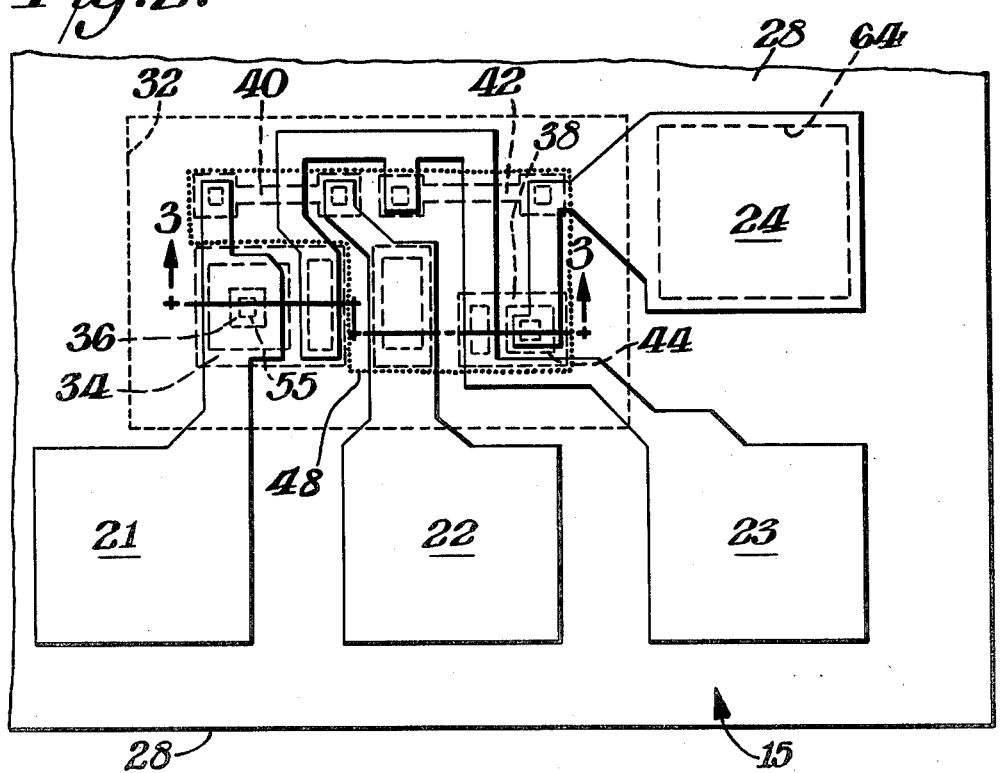
FIG. 2 shows a further enlarged top view essentially to scale of a portion of the wafer of FIG. 1 containing one test pattern having been selectively metallized.

The part of a silicon wafer 10 shown in FIG. 1 reveals a matrix of integrated circuits 12 that have been formed therein, each one of which includes an isolated test pattern 15. Included in each test pattern 15 are four dedicated metal test pads 21, 22, 23 and 24 that are located at a corner of each integrated circuit 12. The scribe lines 26 are formed between adjacent integrated circuits 12 by which they may be broken away and into individual integrated circuit die 28. The portion of such a die 28, that contains a test pattern 15 is seen in FIG. 2. Additional reference to FIGS. 3 and 4 will make the following description of this test pattern 15 more meaningful.

A pocket 30 of N-type epitaxial silicon is bounded by a P-type isolation wall 32. Shallow regions 34, 36, 38, 40 and 42 may be doped with P-type impurities by any of several well known and conventional processes including diffusion and ion implantation. The shallower N-type region 44 is likewise doped from the epitaxial surface 46 of the integrated circuit 15. An N-type buried layer 48 is formed at the interface between the epitaxial pocket 30 and the P-type substrate 50. An N+ plug region 52 contacts the buried layer 48.

In FIG. 2, the outline of the buried layer 48 is shown by dotted line to underly regions 38, 40, 42 and 52, but does not extend under P-type regions 34 and 36. All the diffused or otherwise doped regions 32, 34, 36, 38, 40, 42, 44 and 52, excepting the buried layer 48, are shown by lines made up of short dashes in FIG. 2.

Figure 3:
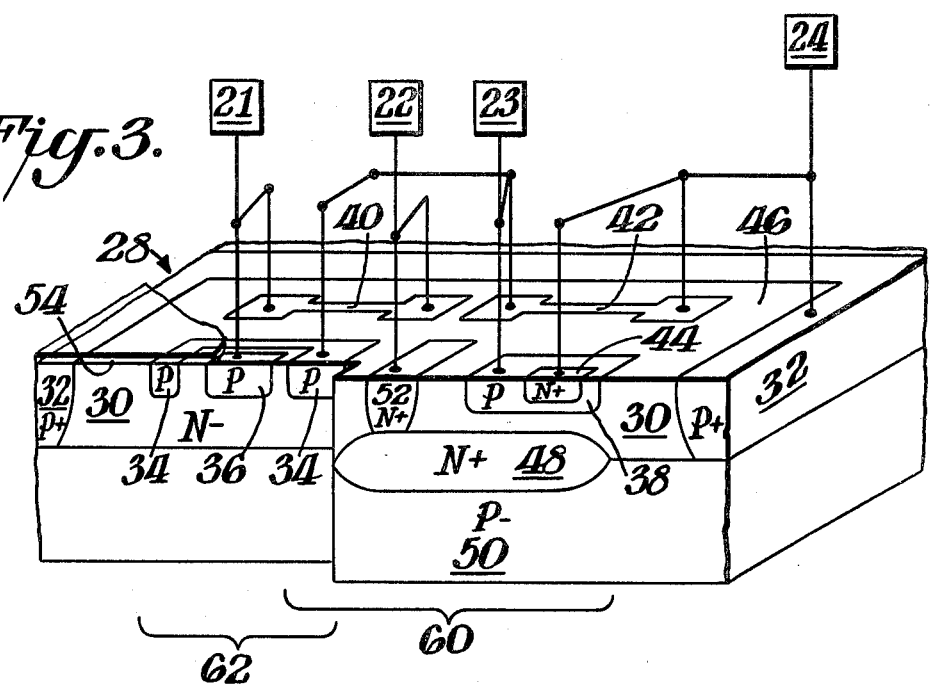
FIG. 3 shows in perspective view the section taken in plane 3—3 of the integrated circuit test pattern of FIG. 2.

A layer of protective glass 54, a portion of which is seen in FIG. 3, overlies the epitaxial surface 46 except for holes provided therein (e.g. hole 55) permitting contact with the various regions. The holes in the glass, e.g. 55, are delineated by lines composed of long dashes.

A thin layer of aluminum is vacuum deposited over the glass 54 and subsequently removed by standard photolithographic and etch steps to provide the separate metal films including test pads 21, 22, 23 and 24.

The metal is omitted for clarity from the perspective view of FIG. 3 and instead a diagramatic system of lines representing conductors shows the connections that will be made by metal.

Figure 4:
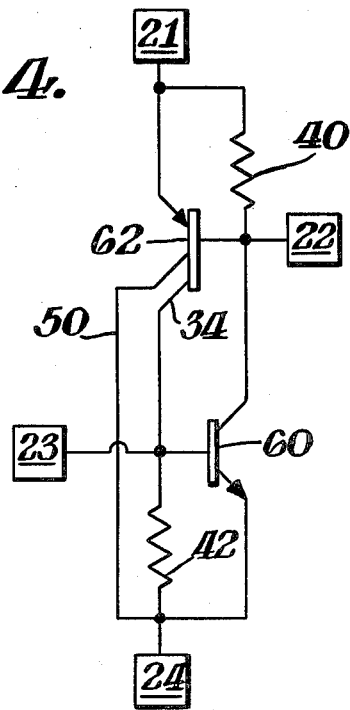
FIG. 4 shows a circuit diagram representing the test pattern of FIG. 2.

The circuit representation in FIG. 4 of the structure depicted in FIGS. 2 and 3, includes an NPN transistor 60 that employs the epitaxial pocket 30 as collector, the region 38 as the base and region 44 as emitter. This conventional vertical double-diffused transistor may be identical to many other NPN transistors that are simultaneously formed in the principle portion of the same integrated circuit. A PNP transistor 62 has a base region consisting of the epitaxial pocket 30. The emitter consists of region 36. A first collector 34 is a commonplace collector used in lateral PNP transistors formed in N-type epitaxial material. The principle part of the integrated circuit may include many such PNP transistors that are formed simultaneously with test PNP transistor 62. The second collector of PNP transistor 62 is the P-type substrate 50. As has been noted, the buried layer 48 has been omitted in this region of the pocket 30 and a vertical PNP is thus formed also.

The substrate 50 of FIG. 13 is the conductor 50 in FIG. 4 that connects the second collector of transistor 62 to test pad 24. A hole 64 in the glass layer 54 over the P-type isolation region 32 is provided. Test pad 24 makes direct contact through hole 64 to the isolation wall 32 as well as the substrate 50.

When the principle portion of the integrated circuit, e.g. 12, contains thin film resistors formed over an insulative layer, such as glass 54 in FIG. 3, then a thin film resistor may be formed simultaneously in the test pattern 15, e.g. in the place of resistor 42. Such a thin film resistor is described by Miles et al in U.S. Pat. No. 4,225,877 issued Sept. 30, 1980 and assigned to the same assignee as is the present invention. The patent further describes a process for making an ion implanted polysilicon resistor over a glass covered region of an integrated circuit containing inter alia bipolar transistors. That process is appropriate for forming the elements of the test pattern 15 of this invention as well as forming the elements (not shown) of the principle portion of integrated circuit 12, and the Miles et al patent is accordingly incorporated herein by reference.

The extension of the metal film of pad 23 seen in FIG. 3 crossing over the resistor 42 represents from a quality standpoint acceptable practice in a test pattern of this invention, which it may not in the principle portion of an integrated circuit 12.

The test pattern described above was incorporated in an integrated circuit die measuring 0.150 in by 0.104 in, or 10 square millimeters in area. The test pattern including terminals 21, 22, 23 and 24 occupies 1.25% of that area or 0.125 mm$^2$.

Thus five different types of components are represented in the test pattern 15 described above. The DC and AC properties of each may be measured at the wafer stage in the manufacturing process by probe contacting only four dedicated contact pads. Each of these measurements may be made essentially unaffected by the presence of the other test pattern components by selecting the appropriate test pads and in some cases applying test voltages of the appropriate polarity. Some of the more important tests are listed in the Table below. Also, the test pads to be used for each test are listed.

TABLE

| COMPONENT | TEST PARAMETER | TEST PADS |
|---|---|---|
| Resistor 40 | Resistance | 21 and 22 |
| Resistor 42 | Resistance | 23 and 24 |
| Lateral PNP | BVcer | 21, 22 and 23 |
| transistor 62 | BVebo | 21 and 22 |
| (collector 34) | $V_{BE}(SAT)$ | 21, 22 and 23 |
|  | $V_{CE}(SAT)$ | 21, 22 and 23 |
|  | $h_{FE}$ | 21, 22 and 23 |
| Vertical PNP | BVcer | 21, 22 and 24 |
| transistor 62 | $V_{BE}(SAT)$ | 21, 22 and 24 |
| (collector 50) | $V_{CE}(SAT)$ | 21, 22 and 24 |
|  | $h_{FE}$ | 21, 22 and 24 |
| NPN | BVcer | 22, 23 and 24 |
| transistor 60 | BVebo | 23 and 24 |
|  | $V_{BE}(SAT)$ | 22, 23 and 24 |
|  | $V_{CE}(SAT)$ | 22, 23 and 24 |
|  | $h_{FE}$ | 22, 23 and 24 |

What is claimed is:

1. An integrated circuit die including a crystalline semiconductor chip having a plurality of resistors, bipolar transistors and other electronic circuit elements interconnected to form the principal circuit of said die and a plurality of metal pads on said chip being connected to and providing electrical access to various points of said principal circuit, wherein the improvement comprises:

a separate test circuit comprised of electrical circuit elements including at least one bipolar transistor, at least one resistor and other metal pads that are adapted to be contacted by probing, said other pads being connected to and providing separate electrical access to various points of said test circuit, all of said electrical circuit elements of said test circuit being formed at only one electrically isolated pocket of said semiconductor chip.

2. The integrated circuit die of claim 1 wherein said at least one bipolar transistor of said test circuit has been formed altogether simultaneously with at least some of said principal circuit transistors.

3. The integrated circuit die of claim 1 wherein a doped substrate portion of said chip is of one polarity type and said pocket is of the opposite polarity type, said at least one transistor being a vertical transistor of a first polarity type, said test circuit additionally comprising a lateral bipolar transistor and another one of said principal circuit transistors also being a lateral bipolar transistor having been altogether simultaneously formed with said lateral test circuit transistor.

4. The integrated circuit die of claim 3 wherein in said test circuit a first, second, third and fourth of said other metal pads are ohmically connected, respectively, to the emitter of said lateral transistor, to said pocket, to the base of said vertical transistor and to the emitter of said vertical transistor.

5. The integrated circuit die of claim 4 additionally comprising an isolation wall of said one polarity type formed in said chip about said pocket, said fourth terminal pad being additionally connected to said one type isolation wall and thus to said one type substrate portion, and said one pocket additionally includes a buried layer of said type at the interface of said pocket and said substrate portion, said buried layer lying under said vertical test circuit transistor and away from the portion of said interface that is under said lateral test circuit transistor so that said one type substrate portion may serve as another collector in said lateral test circuit transistor, to which collector electrical access may be had at said fourth terminal.

6. The integrated circuit die of claim 1 wherein at least one of said principal circuit resistors and said one test circuit resistor are of the diffused type having been formed all together simultaneously; and additionally comprising an insulative layer formed over the outer surface of said die; and another of said test circuit resistors being a thin film type formed on said insulative layer; and another of said principal circuit resistors also being a thin film type having been formed altogether simultaneously with said thin film test circuit resistor.

7. The integrated circuit die of claim 6 wherein within said test circuit said diffused resistor and said thin film resistors are connected, respectively, across the base emitter junctions of said vertical and said lateral transistors.

8. An integrated circuit wafer consisting essentially of a matrix of crystalline semiconductor integrated circuit blocks, each of said blocks being comprised of (a) at least a plurality of bipolar transistors, a plurality of resistors interconnected to form the principal circuit thereof; (b) a plurality of metal pads on said block being connected to and providing electrical access to various points, respectively, of said principal circuit; (c) a separate test circuit including:

one bipolar transistor having been formed all together simultaneously with at least some of said plurality of transistors; and one resistor having been formed simultaneously with at least some of said plurality of resistors; and said one transistor and said one resistor of said test circuit being formed in only one electrically isolated pocket of said each semiconductor block.

* * * * *